(12) United States Patent
Chiba et al.

(10) Patent No.: US 7,461,314 B2
(45) Date of Patent: Dec. 2, 2008

(54) TEST DEVICE

(75) Inventors: Noriaki Chiba, Tokyo (JP); Yasutaka Tsuruki, Tokyo (JP)

(73) Assignee: Advantest Corporation, Tokyo (JP)

( * ) Notice: Subject to any disclaimer, the term of this patent is extended or adjusted under 35 U.S.C. 154(b) by 568 days.

(21) Appl. No.: 11/124,477

(22) Filed: May 6, 2005

(65) Prior Publication Data

US 2005/0210341 A1   Sep. 22, 2005

Related U.S. Application Data

(63) Continuation-in-part of application No. PCT/JP2004/007828, filed on Jun. 4, 2004.

(30) Foreign Application Priority Data

Jun. 6, 2003   (JP) ............................. 2003-162603

(51) Int. Cl.
G01R 31/28 (2006.01)
G06F 11/00 (2006.01)
(52) U.S. Cl. .................................... 714/738
(58) Field of Classification Search ........................ None
See application file for complete search history.

(56) References Cited

U.S. PATENT DOCUMENTS

| | | | | | |
|---|---|---|---|---|---|
| 5,266,851 | A | * | 11/1993 | Nukui | 327/3 |
| 5,463,639 | A | * | 10/1995 | Koishi et al. | 714/740 |
| 5,654,657 | A | * | 8/1997 | Pearce | 327/163 |
| 6,058,057 | A | * | 5/2000 | Ochiai et al. | 365/201 |
| 6,226,765 | B1 | * | 5/2001 | Le et al. | 714/718 |
| 6,263,463 | B1 | * | 7/2001 | Hashimoto | 714/724 |
| 6,374,392 | B1 | * | 4/2002 | Ochiai et al. | 716/6 |
| 6,378,098 | B1 | | 4/2002 | Yamashita | |
| 2004/0268181 | A1 | * | 12/2004 | Wang et al. | 714/30 |
| 2005/0055615 | A1 | * | 3/2005 | Agashe et al. | 714/727 |
| 2005/0235186 | A1 | * | 10/2005 | Wang et al. | 714/728 |
| 2006/0064616 | A1 | * | 3/2006 | Rajski et al. | 714/726 |

FOREIGN PATENT DOCUMENTS

JP   61-47573   3/1986

(Continued)

OTHER PUBLICATIONS

Patent Abstracts of Japan, Publication No. 61-047573 dated Mar. 8, 1986, 1 page.

(Continued)

*Primary Examiner*—Jacques Louis-Jacques
*Assistant Examiner*—Guerrier Merant
(74) *Attorney, Agent, or Firm*—Osha •Liang LLP

(57) ABSTRACT

A test device includes: the first reference clock generation unit for generating the first reference clock; the first test rate generation unit for generating the first test rate clock based on the first reference clock; the first driver unit for supplying the first test pattern to an electronic device based on the first test rate clock; the second reference clock generation unit for generating the second reference clock; the first phase synchronization unit for synchronizing the phase of the second reference clock with the phase of the first test rate clock; the second test rate generation unit for generating the second test rate clock based on the second reference clock having the synchronized phase; and the second driver unit for supplying the second test pattern to the electronic device based on the second test rate clock.

12 Claims, 9 Drawing Sheets

FOREIGN PATENT DOCUMENTS

| JP | 7-209379 | 8/1995 |
|----|----------|--------|
| JP | 11-14704 | 1/1999 |

OTHER PUBLICATIONS

Patent Abstracts of Japan, Publication No. 07-209379 dated Aug. 11, 1995, 1 page.

Patent Abstracts of Japan, Publication No. 11-014704 dated Jan. 22, 1999, 1 page.

International Search Report issued in PCT/JP2004/007828, mailed Sep. 14, 2004, 2 pages.

Supplementary European Search Report issued in European Application No. EP 04 74 5604 mailed on May 10, 2006, 3 pages.

* cited by examiner

TEST DEVICE

The present application is a continuation application of PCT/JP2004/007828 filed on Jun. 4, 2004 which claims priority from a Japanese Patent Application No. 2003-162603 filed on Jun. 6, 2003, the contents of which are incorporated herein by reference.

TECHNICAL FIELD

The present invention relates to a test device for testing an electronic device. More particularly, the present invention relates to a test device for testing an electronic device including a plurality of blocks having different operating frequencies.

RELATED ART

Conventionally, a test device for testing an electronic device such as a semiconductor device, supplies a test pattern having a frequency in accordance with an operating frequency of the electronic device so as to test the electronic device. As an exemplary method for generating the test pattern of the frequency in accordance with the operating frequency of the electronic device, a timing generator is disclosed that delays each pulse of a reference clock so as to obtain a signal having a desired period (see Japanese Patent Application Laid-Open No. 61-47573).

In order to test the electronic device more precisely, it is desirable that the test is performed while a plurality of blocks in the electronic device operate simultaneously. In a case where such a test is performed, according to a conventional technique, a plurality of timing generators or the like were used so as to generate a plurality of clocks in accordance with operating frequencies of the respective blocks, and then test patterns for the respective blocks were generated based on the thus generated clocks and were supplied. However, in the conventional test device, those clocks were not in synchronization with each other. Thus, phases of the respective clocks and test patterns at a timing of a start of the test were not repeatable and it was therefore difficult to perform a repeatable test. Especially, in a case of performing a test while a test module for supplying a test pattern based on the first reference clock of a predetermined frequency and another test module for supplying a test pattern based on the second reference clock of a variable frequency are mounted in the test device together, oscillators for oscillating the first reference clock and the second reference clock, respectively, were different. Thus, it was difficult to perform a repeatable test.

SUMMARY OF THE INVENTION

Therefore, it is one of objects of the present invention to provide a test device, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a test device for testing an electronic device, comprises: a first reference clock generation unit operable to generate a first reference clock having a first frequency; a first test rate generation unit operable to generate a first test rate clock indicating a period with which a first test pattern is supplied to the electronic device, based on the first reference clock; a first driver unit operable to supply the first test pattern to the electronic device based on the first test rate clock; a second reference clock generation unit operable to generate a second reference clock that is variable within a predetermined frequency range; a first phase synchronization unit operable to synchronize a phase of the second reference clock with a phase of the first test rate clock; a second test rate generation unit operable to generate a second test rate clock indicating a period with which a second test pattern is supplied to the electronic device, based on the second reference clock having the phase synchronized; and a second driver unit operable to supply the second test pattern to the electronic device based on the second test rate clock.

The first test rate generation unit may includes: a test period generator operable to generate a test period pulse signal in which a number of pulses in unit time is approximately the same as the first test rate clock based on the first reference clock; and a first timing delay device operable to delay each of pulses in the test pulse signal in such a manner that intervals between pulses are approximately constant and to generate the first test rate clock. The first phase synchronization unit may synchronize the phase of the second reference clock with the phase of the first test rate clock generated by the first timing delay device.

The second test rate generation unit may includes: a reference clock oscillation unit operable to generate a reference clock having a frequency obtained by multiplying a frequency of the second reference clock by an integer that is equal to or larger than two; a reference clock divider operable to divide the reference clock to generate the second test rate clock; a test rate clock divider operable to divide the second test rate clock to generate a test rate divided clock having a frequency that is approximately the same as the frequency of the second reference clock; and a phase adjustment unit operable to adjust a phase of the reference clock based on a phase error between the second reference clock and the test rate divided clock.

The second reference clock generation unit may include: a variable frequency clock generator operable to generate a variable frequency clock that is variable within a predetermined frequency range; and a variable frequency clock divider operable to divide the variable frequency clock to generate the second reference clock having a frequency that is approximately the same as a frequency of the first test rate clock, and the first phase synchronization unit may include: a phase detector operable to detect a phase error between the first test rate clock and the second reference clock; and a phase adjustment unit operable to synchronize a phase of the variable frequency clock with the phase of the first test rate clock based on the phase error.

The test device may further comprise a pattern start signal generation unit operable to generate a pattern start signal for starting supply of the first test pattern and the second test pattern to the electronic device while the second reference clock and the first test rate clock are in phase-synchronization with each other, wherein the first driver unit and the second driver unit start to supply the first test pattern and the second test pattern, respectively, based on the pattern start signal.

The test device may further comprise: a first pattern start signal synchronization unit operable to synchronize the pattern start signal with the first test rate clock; and a second pattern start signal synchronization unit operable to synchronize the pattern start signal with the second test rate clock, wherein the first driver unit starts to supply the first test pattern based on the pattern start signal synchronized with the first test rate clock, and the second driver unit starts to supply the second test pattern based on the pattern start signal synchronized with the second test rate clock.

Each of the first test rate generation unit and the first driver unit may include: a test period generator operable to a test period pulse signal that is the same as the first test rate clock in a number of pulses in unit time, based on the first reference clock; and a first timing delay device operable to generate a delay signal obtained by delaying each of pulses in the test period pulse signal, and the first timing delay device of the first test rate generation unit may generate the first test rate clock that is the delay signal obtained by delaying each of pulses in the test period pulse signal to make intervals between the pulses approximately constant, and the first timing delay device of the first driver unit may generate the first test pattern that is the delay signal obtained by delaying each of pulses in the test period pulse signal by a time determined in accordance with the first test pattern.

The test device may further comprise: a pattern start signal generation unit operable to generate a pattern start signal for starting supply of the first test pattern and the second test pattern to the electronic device while the second reference clock and the first test rate clock are in phase-synchronization with each other, wherein the second driver unit includes a second timing delay device operable to generate the second test pattern by delaying each of pulses in the second test rate clock, and delay amounts arte set in the first timing delay device and the second timing delay device in such a manner that the first driver unit and the second driver unit start to supply the first test pattern and the second test pattern to the electronic device, respectively, in synchronization with each other based on the pattern start signal.

The test device may further comprise a synchronization start signal supply unit operable to supply a synchronization start signal for causing the first test rate generation unit to start generation of the first test rate clock, in a case of starting the supply of the first test pattern and the second test pattern, wherein the pattern start signal generation unit generates the pattern start signal that causes the first driver unit and the second driver unit to start to supply the first test pattern and the second teat pattern to the electronic device, respectively, while the second reference clock is in phase-synchronization with the first test rate clock that the first test rate generation unit started to generate upon receipt of the synchronization start signal.

The test device may further comprise: a third reference clock generation unit operable to generate a third reference clock that is variable within a predetermined frequency range; a second phase synchronization unit operable to synchronize a phase of the third reference clock with the phase of the first test rate clock; a third test rate generation unit operable to generate a third test rate clock indicating a period with which a third test pattern is supplied to the electronic device, based on the third reference clock that was in phase-synchronization; and a third driver unit operable to supply the third test pattern to the electronic device based on the third test rate clock.

The test device may further comprise: a third test rate generation unit operable to generate a third test rate clock indicating a period with which a third test pattern is supplied to the electronic device, based on the first reference clock; a third driver unit operable to supply the third test pattern to the electronic device based on the third test rate clock; third reference clock generation unit operable to generate a third reference clock that is variable within a predetermined frequency range; a second phase adjustment unit operable to synchronize a phase of the third reference clock with a phase of the third test rate clock; a fourth test rate generation unit operable to generate a fourth test rate clock indicating a period with which a fourth test pattern is supplied to the electronic device, based on the third reference clock that was in phase-synchronization; and a fourth driver unit operable to supply the fourth test pattern to the electronic device based on the fourth test rate clock.

The summary of the invention does not necessarily describe all necessary features of the present invention. The present invention may also be a sub-combination of the features described above.

According to the present invention, it is possible to provide a test device that can test an electronic device including a plurality of blocks having different operating frequencies with high precision.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
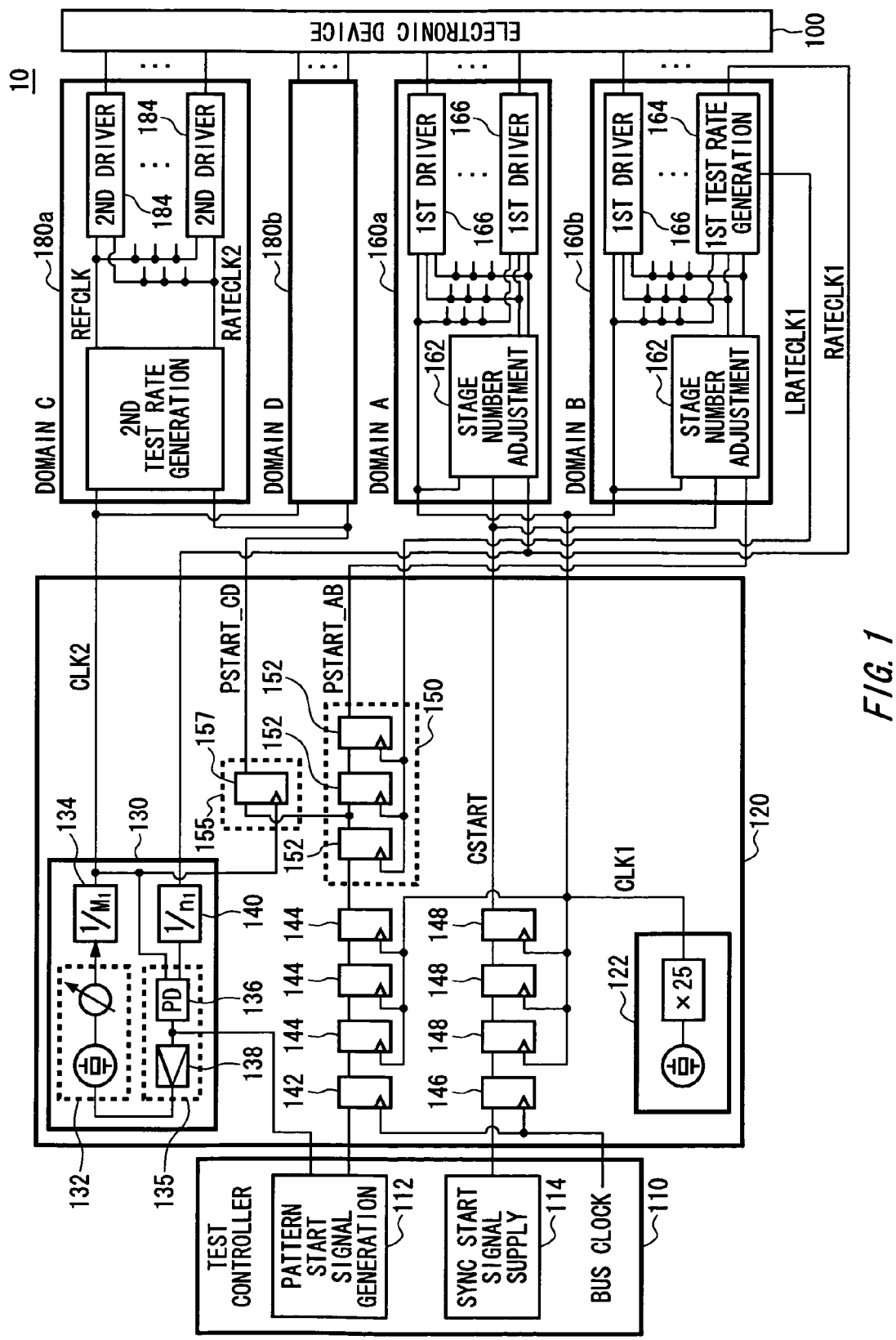
FIG. 1 illustrates a structure of a test device 10 according to an embodiment of the present invention.

FIG. 1 illustrates a structure of a test device 10 of an embodiment of the present invention. The test device 10 of the present embodiment includes the first test module 160 for testing an electronic device 100 based on the first reference clock (CLK1 in FIG. 1) and the second test module for testing the electronic device 100 based on the second reference clock (CLK2 in FIG. 2), and aims to perform a repeatable test by synchronizing a phase of the first test pattern supplied from the first test module 160 to the electronic device 100 and a phase of the second test pattern supplied from the second test module 180 to the electronic device 100 with each other.

The electronic device 100 includes a plurality of blocks having different operating frequencies. The electronic device 100 may be a single semiconductor chip or may be formed by a plurality of semiconductor chips having different operating frequencies.

The test device 100 includes: a test controller 110 for controlling a start and a stop of a test; a clock supply unit 120 for supplying the first reference clock to the first test module 160 and supplying the second reference clock to the second test module 180; one or more first test modules 160 for generating the first test pattern based on the first reference clock and supplying the first test pattern to the electronic device 100; and one or more second test module 180 for generating the second test pattern based on the second reference clock and supplying the second test pattern to the electronic device 100.

The test controller 110 supplies a synchronization start signal that indicates a start of synchronization of the first test modules 160a-160b and the second test modules 180a-180b with each other, to the clock supply unit 120 prior to a start of a test. The test controller 110 also supplies a pattern start signal indicating a start of supply of the test patterns to the electronic device 100 to the clock supply unit 120, while the first test module 160 and the second test module 180 are synchronized with each other.

The clock supply unit 12 generates the first reference clock of the first frequency and supplies it to the first test modules 160a-160b, and also generates the second reference clock that is variable within a predetermined frequency range and supplies the second reference clock to the second test modules 180a-180b. In the present embodiment, the clock supply unit 120 generates the first reference clock of 250 MHz and the second reference clock of 200 MHz, for example. Moreover, the clock supply unit 120 supplies the synchronization start signal to the first test modules 160a-160b and supplies the pattern start signal to the first test modules 160a-160b and the second test modules 180a-180b.

Each of the first test modules 160a-160b generates the first test rate clock (RATECLK1 in FIG. 1) indicating a period with which the first test pattern is supplied to the electronic device 100, based on the first reference clock, and supplies the first test pattern based on the first test rate clock. In the present embodiment, the first test modules 160a-160b generate the first teat rate clock of approximately 200 MHz, for example. The first test modules 160b feeds the first test rate clock back to the clock supply unit 120. Based on the first rate clock back fed back from the first test module 160b, the clock supply unit 120 synchronizes the second test module 180 with the first test module 160.

Each of the second test modules 180a-180b generates the second test rate clock (RATECLK2 in FIG. 1) indicating a period with which the second test pattern is supplied to the electronic device 100, based on the second reference clock, and supplies the second test pattern to the electronic device 100 based on the second test rate clock.

In the above description, the first test module 160a and/or terminals of the electronic device 100 for which the first test module 160a performs a test are called as a domain A; the first test module 160b and/or terminals of the electronic device 100 for which the first test module 160b performs a test are called as a domain B; the second test module 180a and/or terminals of the electronic device 100 for which the second test module 180a performs a test are called as a domain C; and the second test module 180b and/or terminals of the electronic device 100 for which the second test module 180b performs a test are called as a domain D.

Next, the structure of the test controller 110, the clock supply unit 120, the first test module 160 and the second test module 180 is described.

The test controller 110 includes a synchronization start signal supply unit 114 and a pattern start signal generation unit 112. The synchronization start signal supply unit 114 generates a synchronization start signal that causes the first test module 160b to start generation of the first test clock prior to a test of a start, and supplies the synchronization start signal to the first test module 160b via the clock supply unit 120. The pattern start signal generation unit 112 generates a pattern start signal that starts supply of the first and second test patterns to the electronic device 100, while the phase of the second reference clock is synchronized with that of the first test rate clock. The synchronization start signal and the pattern start signal are supplied to the clock supply unit 120 via a bus for connecting the test controller 110 to the clock supply unit 120 in synchronization with a bus clock that is a clock of the bus.

The clock supply unit 120 includes the first reference generation unit 122, the second reference clock generation unit 130, a flip-flop 142, a plurality of flip-flops 144, a flip-flop 146, a plurality of flip-flop 148, the first pattern start signal synchronization unit 150 and the second pattern signal synchronization unit 155.

The first reference clock generation unit 122 includes an oscillator and a frequency-multiplier, for example, and generates the first reference clock. In the present embodiment, the first reference clock generation unit 122 multiplies a 10 MHz clock oscillated by the oscillator by 25 and supplies the multiplied clock as the first reference clock, for example.

The second reference clock generation unit 130 includes a variable frequency clock generator 132, a variable frequency clock divider 134, a phase synchronization unit 135 and a test rate clock divider 140 and generates the second reference clock. The variable frequency clock generator 132 generates a clock of a variable frequency that can vary in a predetermined frequency range and supplies that clock to the variable frequency clock divider 134. In this embodiment, the variable frequency clock generator 132 generates a clock of a variable frequency that can vary in an octave frequency range, for example, in a range from 1 GHz to 2 GHz. In a test of the electronic device 100 according to the present embodiment, the variable frequency clock generator 132 sets the variable frequency clock to 2 GHz, for example.

The variable frequency clock divider 134 divides the variable clock to $1/M_1$ so as to generate the second reference clock having approximately the same frequency as the first test rate clock. In the present embodiment, the variable frequency clock divider 134 divides the variable frequency clock of 2 GHz to 1/10 ($M_1$=10), thereby generating the second reference clock of 200 MHz, for example.

The phase synchronization unit 135 includes a phase detector 136 and a phase adjustment unit 138, and synchronizes the phase of the second reference clock with that of the first test rate clock. The phase detector 136 detects a phase error between the first test rate clock supplied from the first test module 160b via the test rate clock divider 140 and the second reference clock generated by the variable frequency clock divider 134. The phase detector 136 supplies the detected phase error to the pattern start signal generation unit 112 of the test controller 110. The pattern start signal generation unit 112 determines whether or not the second reference clock is in phase-synchronization with the first test rate clock based on the phase error received from the phase detector 136. The phase adjustment unit 138 adjusts the phase of the variable frequency clock oscillated by the variable frequency clock generator 132 based on the phase error detected by the phase detector 136, thereby synchronizing the phase of the variable frequency clock with the phase of the first test rate clock.

The test rate clock divider 140 divides the first test rate clock to $1/n_1$ and supplies the first test rate clock that was divided to have approximately the same frequency as that of the second reference clock to the phase detector 136 of the phase synchronization unit 135. In the present embodiment, $n_1$ is set to one in the test rate clock divider 140, and the test rate clock divider 140 supplies the first test rate clock of approximately 200 MHz to the phase detector 136. In a case where the first test rate clock and the second test rate clock are 200 MHz and 100 MHz, respectively, in another electronic device 100 or the like, the test rate clock divider 140 may halve the first test rate clock.

The flip-flop 142 receives the pattern start signal in synchronization with the bus clock. A plurality of flip-flops 144 receive the pattern start signal that is in synchronization with the bus clock, in synchronization with the first reference clock and convert the pattern start signal into a signal synchronized with the first reference clock. The flip-flops 144 are arranged in series. Each flip-flop 144 receives the pattern start signal output from the preceding flip-flop 144, in synchronization with the first reference clock and outputs it to the next flip-flop 144. Thus, the pattern start signal can be prevented from becoming metastable.

The flip-flop 146 receives the synchronization start signal in synchronization with the bus clock. A plurality of flip-flops 148 receive the synchronization start signal synchronized with the bus clock, in synchronization with the first reference clock, thereby converting the thus received signal into the synchronization start signal (CSTART in FIG. 1) synchronized with the first reference clock, in a similar manner to that of the flip-flops 144.

The first pattern start signal synchronization unit 150 synchronizes the pattern start signal synchronized with the first reference clock, with the first test rate clock so as to generate a pattern start signal for the domains A and B (PSTART_AB). In other words, the first pattern start signal synchronization unit 150 receives the pattern start signal output from the last flip-flop 144 in synchronization with the first test rate divided clock (LRATECLK1 in FIG. 1) supplied from the first test module 160b. Please note that the first test rate divided clock is a clock obtained by division of the first test rate clock by the first test module 160b. The first pattern start signal synchronization unit 150 receives the pattern start signal in synchronization with the first test rate divided clock, thereby synchronizing the pattern start signal with the first test rate clock.

The first pattern start signal synchronization unit 150 includes a plurality of flip-flops 152 arranged in series to prevent the pattern start signal from becoming metastable. The first flip-flop 142 receives the pattern signal, that was output from the last one of the flip-flops 144, in synchronization with the first test rate divided clock and outputs the received pattern start signal to the next flip-flop 152. Each of the flip-flops 152 after the first flip-flop 152 receives the pattern start signal output from the preceding flip-flop 152 in synchronization with the first test rate divided clock and outputs the received pattern start signal to the next flip-flop 152.

The second pattern start signal synchronization unit 155 synchronizes the pattern start signal synchronized with the first reference clock, with the second reference clock so as to generate a pattern start signal (PSTART_CD) for the domains C and D. The second pattern start signal synchronization unit 155 includes a flip-flop 157 for receiving the pattern start signal synchronized with the first test rate clock, that was output from any of the flip-flops 152, in synchronization with the second reference clock.

The test module 160b includes a stage number adjustment unit 162, the first test rate generation unit 164 and one or more first driver units 166. The stage number adjustment unit 162 is a stage number adjusting circuit provided for making the number of stages of flip-flops in a path from a point at which the first test module 160b receives the pattern start signal for the domain A and B to a point at which the first test module 160b supplies a test pattern to the electronic device 100 coincident with the number of stages of flip-flops in a path from a point at which the second test module 180 receives the pattern start signal for the domains C and D to a point at which the second test module 180 supplies a test pattern to the electronic device 100.

The first test rate generation unit 164 generates the first test rate clock and the fist test rate divided clock based on the first test rate clock. One or more first driver units 166 supply the first test pattern to the electronic device 100 based on the first reference clock. More specifically, one or more first driver units 166 may be provided to correspond to one or more terminals of the electronic device 100, respectively, and each first driver unit 166 may supply a section of the first test pattern, that is to be supplied to the corresponding terminal, to the electronic device 100. The first test module 160a has similar function and structure to those of the first test module 160b except that the first test module 160a does not include the first test rate generation unit 164 for feeding the first test rate clock and the like back to the clock supply unit 120. Therefore, the description of the first test module 160a is omitted.

The second test module 180a includes the second test rate generation unit 182 and the second driver 184. The second test rate generation unit 182 generates the second test rate clock and a reference clock (RFCLK in FIG. 1) based on the second reference clock that was generated by the variable frequency clock generator 132 and the variable frequency clock divider 134 and was then synchronized in phase with the first test rate clock by the phase synchronization unit 135. The second driver 184 supplies the second test pattern to the electronic device 100 based on the second test rate clock. More specifically, one or more second drivers 184 may be provided to correspond to one or more terminals of the electronic device 100, respectively, and each second driver 184 may supply a section of the second test pattern, that is to be supplied to the corresponding terminal, to the electronic device 100. Since the second test module 180b has similar function and structure to those of the second test module 180a, the description of the second test module 180b is omitted.

As described above, according to the test device 10 of the present embodiment, the first driver unit 166 of the first test module 160 and the second driver 184 of the second test module 180 start to supply the first test pattern and the second test pattern based on the pattern start signal, respectively. More specifically, the first driver unit 166 starts to supply the first test pattern based on the pattern start signal for the domains A and B synchronized with the first test rate clock, while the second driver 184 starts to supply the second test pattern based on the pattern start signal for the domains C and D synchronized with the second test rate clock. Since the test controller 110 generates a pattern start signal for starting the supply of the test pattern to the electronic device 100 while the phases of the second reference clock and the first test rate clock are synchronized with each other, the first test module 160 and the second test module 180 can synchronize the phases of the first test pattern and the second test pattern with each other.

Figure 2:
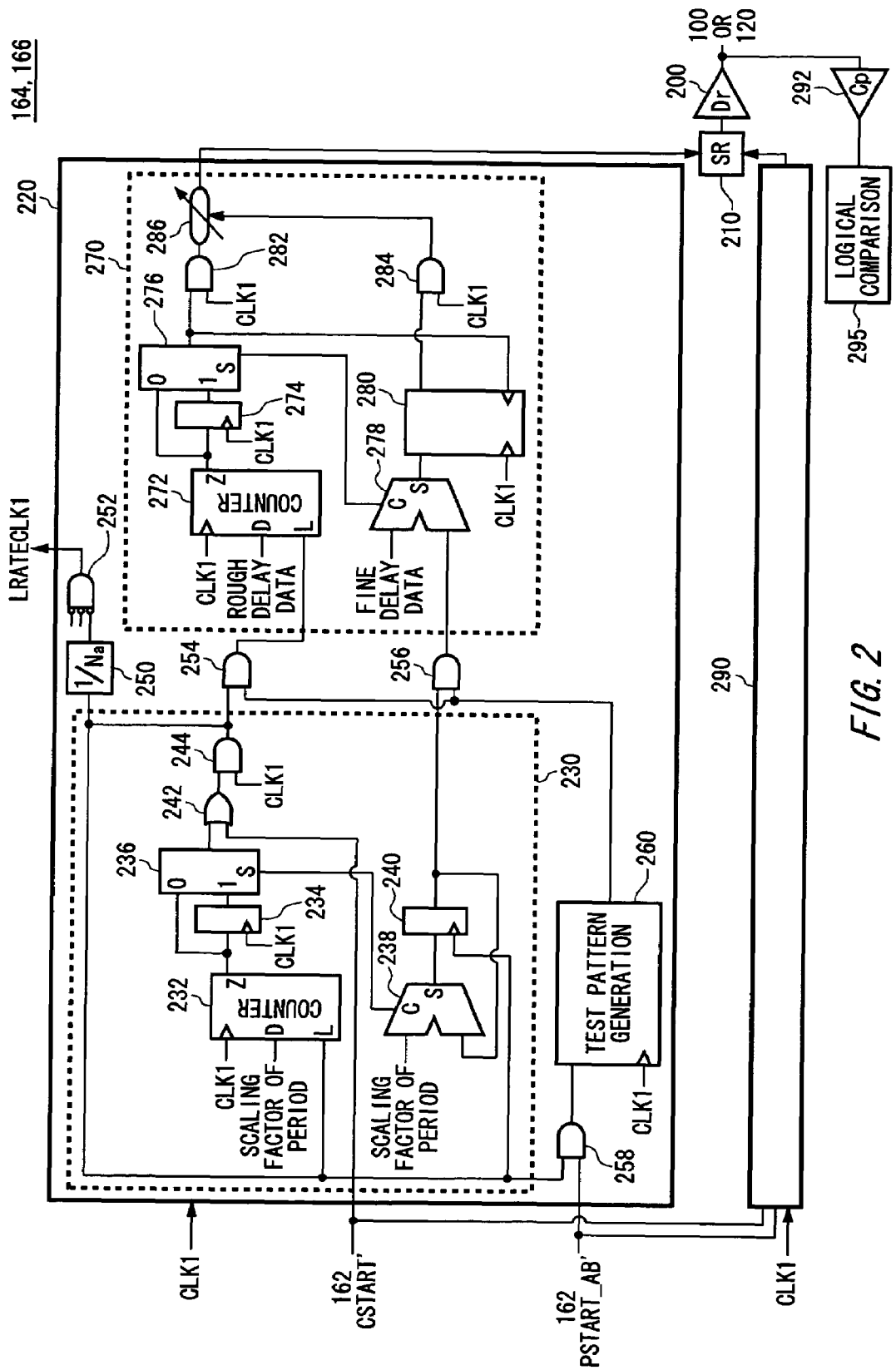
FIG. 2 illustrates a structure of the first test rate generation unit 164 and first driver unit 166 according to the embodiment of the present invention.

FIG. 2 illustrates the structures of the first test rate generation unit 164 and the first driver unit 166 according to the present embodiment. In the present embodiment, the first test rate generation unit 164 and the first driver unit 166 have the same or similar structure. Thus, the description is now made mainly to the first test rate generation unit 164, and the description of the first driver unit 166 is omitted except for the difference from the first test rate generation unit 164.

Each of the first test rate generation unit 164 and the first driver unit 166 includes a set signal generation unit 220, a reset signal generation unit 290, an SR latch 210, the first driver 200, a comparator 292 and a logical comparator 295.

The set signal generation unit 220 in the first test rate generation unit 164 generates a set signal indicative of a timing of a rising edge of the first test rate clock based on the first reference clock and the synchronization start signal that was received from the stage number adjustment unit 162, while the reset signal generation unit 290 in the first test rate generation unit 164 generates a reset signal indicative of a timing of a falling edge of the first test rage clock based on the first reference clock and the synchronization start signal.

On the other hand, the set signal generation unit 220 in the first driver unit 166 generates a set signal indicative of a rising edge of the first test pattern to be supplied by the first driver unit 166, based on the first reference clock, and the synchronization start signal and the pattern start signal that were received from the stage number adjustment unit 162. The reset signal generation unit 290 in the first driver unit 166 generates a reset signal indicative of a timing of a falling edge of the first test pattern to be supplied by the first driver unit 166, based on the first reference clock, and the synchronization start signal and the pattern start signal that were received from the stage number adjustment unit 162.

The SR latch 210 receives the set signal and the reset signal, changes its output to H logic (set) at the timing generated by the set signal generation unit 220 and changes its output to L logic (reset) at the timing generated by the reset signal generation unit 290. In this manner, the SR latch 210 of the first test rate generation unit 164 generates the first test rate clock based on the set signal and the reset signal, while the SR latch 210 of the first driver unit 166 generates the first test pattern based on the set signal and the reset signal. The first driver 200 of the first test rate generation unit 164 supplies the first test rate clock generated by the SR latch 210 thereof to the clock supply unit 210. The first driver 200 of the first driver unit 166 supplies the first test pattern generated by the SR latch 210 thereof to the electronic device 100.

The comparator 292 of the first driver unit 166 detects whether or not an output signal output from the electronic device 100 in accordance with the test pattern exceeds a predetermined reference voltage, and supplies the detection result to the logical comparator 295. The logical comparator 295 of the first driver unit 166 compares the detection result from the comparator 292 with an expected value of the output signal, thereby determining whether the electronic device 100 is non-defective or defective. On the other hand, in the first test rate generation unit 164, the comparator 292 and the logical comparator 295 may not be used.

In the above description, the set signal generation unit 220 and the reset signal generation unit 290 in the first test rate generation unit 164 have substantially the same structures and functions as those of the set signal generation unit 220 and the reset signal generation unit 290 in the first driver unit 166. Therefore, as for the reset signal generation unit 290 of the first test rate generation unit 164 and the set signal generation unit 220 and the reset signal generation unit 290 of the first driver unit 166, the description is omitted except for the differences from the set signal generation unit 220 of the first test rate generation unit 164.

The set signal generation unit 220 includes a test frequency generator 230, a frequency-divider 250, a NOR device 252, an AND device 254, an AND device 256, an AND device 258, a test pattern generator 260 and a timing delay device 270.

The test frequency generator 230 generates a test period pulse signal in which the number of pulses in unit time is substantially the same as that in the first test rate clock. More specifically, in the test frequency generator 230, a scaling factor of period X that indicates a scaling factor of the period of the first test rate clock with respect to the first reference clock. The test frequency generator 230 generates the test period pulse signal in which the number of pulses in unit time is 1/X of the first reference clock.

The test frequency generator 230 includes a counter 232, a flip-flop 234, a selector 236, an adder 238, a register 240, an OR device 242 and an AND device 244.

The counter 232 is a down counter that operates in synchronization with the first reference clock. Every time the AND device 244 outputs a pulse as a test period pulse signal, this pulse is input to an L terminal (load terminal) of the counter 232. The counter 232 sets a counter value to $X_H$ that is the integer portion of the scaling factor of period X. Then, the counter 232 decrements the counter value in synchronization with the first reference clock and sets a Z terminal to have a logical value "1" when the counter value reached zero. In this manner, the counter 232 sets the Z terminal to have the logical value "1" after a time that is $X_H$ times the period of the first reference clock passed after the pulse input to the L terminal.

The flip-flop 234 receives a signal value of the Z terminal in synchronization with the first reference clock and outputs it to the selector 236. The selector 236 outputs the signal value of the Z terminal of the counter 232 to the OR device 242 when receiving a carry output "0" from the adder 238, and outputs the output of the flip-flop 234 to the OR device 242 when receiving a carry output "1" from the adder 238.

The adder 238 and the register 240 adjust a timing at which the AND device 244 outputs a pulse as a test period pulse signal, based on $X_L$ that is the fractional portion of the scaling factor of period X. The adder 238 adds the fractional portion $X_L$ of the scaling factor of period to a register value stored in the register 240. The register 240 stores a result of addition by the adder 238, i.e., the fractional portion of the result of addition in the present embodiment, therein in synchronization with the pulse input to the L terminal. The register 240 calculates a fractional portion of a value of accumulation of the fractional portion $X_L$ of the scaling factor of period X in synchronization with the pulse input to the L terminal.

In a case where, as a result of adding the fractional portion of the value of accumulation to the fractional portion XL of the scaling factor of period X, a carry with respect to the integer portion of the scaling factor of period X was generated, the adder 238 supplies a carry output "1" to the selector 236. When receiving the carry output "1", the selector 236 outputs the output of the flip-flop 234 to the OR device 242 instead of outputting the signal value of the Z terminal of the counter 232. Thus, in a case where, as a result of accumulation of the fractional portion $X_L$ of the scaling factor of period X, no carry is generated with respect to the integer portion, the selector 236 outputs a logical value "1" after the time that is $X_H$ times the period of the first reference clock passed after the pulse input to the L terminal. On the other hand, in a case where a carry was generated, the selector 236 outputs a logical value "1" after a time that is ($X_H$+1) times the period of the first reference clock passed after the pulse input to the L terminal. As a result, the selector 236 outputs the logical number "1" approximately the same number times as the pulse number in the first test rate clock in unit time.

The OR device 242 outputs OR of the output of the selector 236 and the synchronization start signal received from the stage number adjustment unit 162. The AND device 244 outputs AND of the output of the OR device 24 and the first reference clock, thereby converting the output of the OR device 242 into a pulse signal so as to output that pulse signal as a test period pulse signal. On the other hand, when receiving the synchronization start signal corresponding to one period of the first reference clock while no pulse is output to the test period pulse signal, the OR device 242 and the AND device 244 output a pulse to the test period pulse signal and also causes the counter value of the counter 232 and the register value of the register 240 to be set so as to start the output of the pulse to the test period pulse signal.

The frequency-divider 250 divides the test pulse signal with a division ratio of $1/N_a$. The frequency-divider 250 divides the test period pulse signal in such a manner that the divided signal has a period that is a common multiple of the first reference clock and the first test rate clock, thereby removing a difference between intervals of the pulse supplied to the test period pulse signal by the fractional portion $X_L$ of the scaling factor of period X. Thus, the frequency-divider 250 generates the first test rate divided clock obtained by division of the first test rate clock, which has approximately the same pulse intervals. For example, in a case where the first reference clock is 250 MHz and the test period pulse signal and the first test rate clock is 200 MHz, $N_a$ may be set to four so as to generate the first teat rate divided clock of 50 MHz that is synchronized with the first test rate clock. The NOR device 242 supplies the first test rate divided clock generated by the frequency-divider 250 to the clock supply unit 120 in a case where the other input signal is "0".

The AND device 250 outputs AND of the test period pulse signal and the pattern start signal for the domains A and B. The test pattern generator 260 of the first driver unit 166 receives the pulse of the test period pulse signal input thereto while the pattern start signal for the domains A and B has a logical value "1", and outputs a set signal for the first test pattern that is supplied to the electronic device 100 in a test cycle corresponding to that pulse. The test pattern generator 260 of the first test rate generation unit 164 may always output the set signal so as to set the first test rate clock for every pulse of the test period pulse signal.

The AND device 254 outputs AND of the test period pulse signal output from the test frequency generator 230 and the first test rate clock or the set signal for the first test pattern that is output from the test pattern generator 260. The AND device 256 outputs AND of the fractional portion of the accumulated value of the fractional portion $X_L$ of the scaling factor of period X, that is stored in the register 240, and the first test rate clock or the set signal for the first test pattern.

The timing delay device 270 generates a delay signal obtained by delaying each pulse in the test period pulse signal input via the AND device 254. The timing delay device 270 of the first test rate generation unit 164 generates the first test rate clock that is a delay signal obtained by delaying each pulse in the test period pulse signal in such a manner that the pulse intervals are approximately the same. On the other hand, the timing delay device 270 of the first driver unit 166 generates the first teat pattern that is a delay signal obtained by delaying each pulse in the test period pulse signal by a predetermined time that was determined in advance in accordance with the first test pattern. The timing delay device 270 includes a counter 272, a flip-flop 274, a selector 276, a register 280, an AND device 284 and a variable delay element 286.

The counter 272 delays each pulse of the test period pulse signal by a time that is integral multiplication of the first reference clock based on rough delay data that was determined in accordance with that pulse. More specifically, every time a pulse of the test period pulse signal was input to the L terminal, the counter 272 sets the rough delay data that was determined to correspond to that pulse, as its counter value. The counter 272 then decrements the counter value in synchronization with the first reference clock, and sets its Z terminal to have a logical value "1" when the counter value reached zero. Thus, the counter 272 outputs a level signal that is obtained by delaying each period of the test period pulse signal from the pulse input to the L terminal by a time obtained by multiplying the period of the first reference clock by an integer determined by the rough delay data.

The flip-flop 274 receives a signal value of the Z terminal in synchronization with the first reference clock and outputs it to the selector 276. The selector 276 outputs the signal value of the Z terminal of the counter 272 to the AND device 282 and the register 280 when receiving a carry output "0" from the adder 278, and outputs the output of the flip-flop 274 to the AND device 282 and the register 280 when receiving a carry output "1" from the adder 278.

The adder 278 receives the fractional portion of the value of accumulation of the fractional value $X_L$ of the scaling factor of period X from the AND device 256, and adds fine delay data that was determined in accordance with each pulse of the test period pulse signal, to the received fractional portion. As a result, in a case where a carry output "1" is generated, the adder 278 outputs the carry output "1", thereby further delaying the output of the selector 276 by a time corresponding to the period of the first reference clock. The register 280 stores a result of addition of the fractional portion of the value of accumulation of the fractional value $X_L$ of the scaling factor of period X and the fine delay data, as a register value in synchronization with the first reference clock. The register 280 then outputs the register value in synchronization with the rising of the level signal output from the selector 276.

The AND device 282 obtains AND of the first reference clock and the level signal output from the selector 276, thereby converting the level signal output from the selector 276 into a pulse signal synchronized with the first reference clock. The AND device 284 obtains AND of the first reference clock and the register value output from the register 280. Thus, the AND device 284 supplies fine delay amount that delays each pulse of the test period pulse signal, to the variable delay element 286 in synchronization with the first reference clock. The variable delay element 286 delays the test period pulse signal in which the position of each pulse was adjusted by being delayed with the rough delay data, by the minute delay amount supplied from the AND device 284 and outputs the resultant signal as a set signal for the SR latch 210.

As described above, the timing delay device 270 delays each pulse of the test period pulse signal by the rough delay data determined in accordance with that pulse and the fine delay data, thereby generating the set signal which is delayed so as to have approximately the same pulse interval. Similarly, the timing delay device 270 of the reset signal generation unit 290 delays each pulse of the test period pulse signal by the rough delay data determined in accordance with that pulse and the fine delay data, thereby generating the reset signal which is delayed so as to have approximately the same pulse interval. As a result, the timing delay device 270 of the set signal generation unit 220 and the timing delay device 270 of the reset signal generation unit 290 can generate the first test rate clock by delaying each pulse of the test period pulse signal in such a manner that the pulse intervals become approximately the same.

On the other hand, the timing delay devices 270 of the set signal generation unit 220 and the reset signal generation unit 290 of the first driver unit 166 delay each pulse of the test period pulse signal input via the AND device 254 by rough delay data and fine delay data determined to correspond to the first test pattern, thereby generating the first test pattern. In this case, the rough delay data and the fine delay data that are set in the timing delay device 270 are set to provide a delay amount obtained by adding a delay amount for converting each pulse of the test period pulse signal into the first test rate clock and a delay amount of the output timing of the first test pattern with respect to the first teat rate clock.

As described above, the first test rate generation unit 164 generates the first test rate clock having a period that is X times the period of the first reference clock by the test frequency generator 230 and the timing delay device 270 based on the first reference clock and the scaling factor of period X. The phase synchronization unit 135 of the second reference clock generation unit 130 synchronizes the phase of the second reference clock with the phase of the first test rate clock that was generated by the timing delay devices 270 of the set signal generation unit 220 and the reset signal generation unit 290 of the first test rate generation unit 164. Thus, the first test module 160 and the second test module 180 can supply the first test pattern and the second test pattern that are in phase-synchronization with each other to the electronic device 100.

Figure 3:
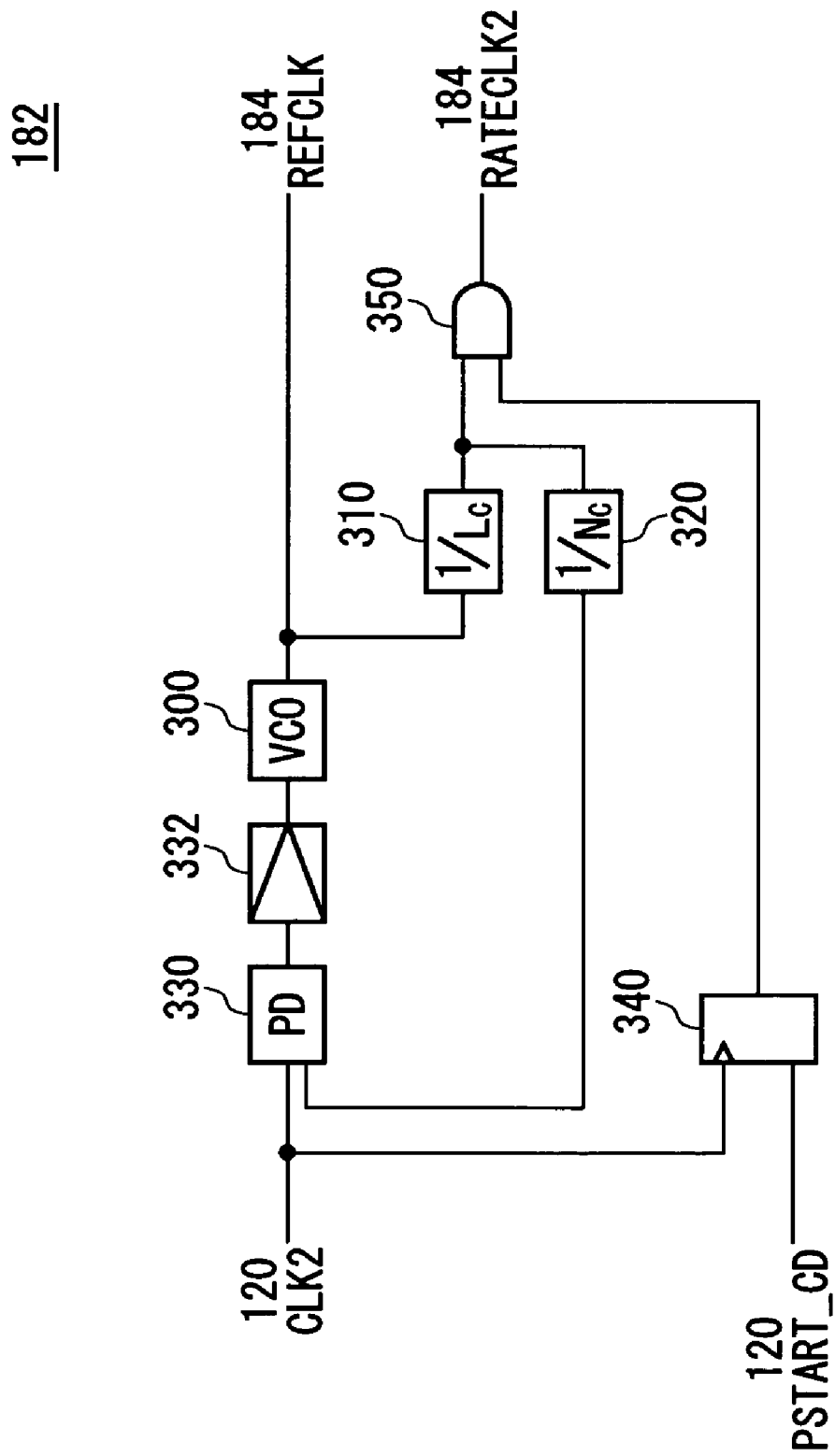
FIG. 3 illustrates a structure of the second test rate generation unit 182 according to the embodiment of the present invention.

FIG. 3 illustrates the structure of the second test rate generation unit 182 according to the present embodiment. The second test rate generation unit 182 includes a referred clock oscillation unit 300, a referred clock divider 310, a test rate clock divider 320, a phase detector 330, a phase adjustment unit 332, a flip-flop 340 and an AND device 350.

The referred clock oscillation unit 300 generates a referred clock (REFCLK in FIG. 3) having a frequency obtained by multiplying the frequency of the second reference clock by an integer that is equal to or larger than two. For example, in a case where the second reference clock has a frequency of 200 MHz, the second test rate generation unit 182 of the second test module 180a generates a referred clock of 800 MHz and the second test rate generation unit 182 of the second test module 180b generates a referred clock of 1.6 GHZ. The referred clock oscillation unit 300 may be a voltage controlled oscillator.

The referred clock divider 310 divides the referred clock output from the referred clock oscillation unit 300 so as to generate the second test rate clock (RATECLK2 in FIG. 3) in the second test module 180a. The referred clock divider 310 in the second test module 180a and the referred clock divider 310 in the second test module 180b divide the corresponding referred clocks with division ratios of $1/L_c$ and $1/L_d$, respectively. For example, the referred clock divider 310 in the second test module 180a generates the second test rate clock of 400 MHz that is obtained by halving the referred clock of 800 MHz ($L_c=2$) and the referred clock divider 310 in the second test module 180b generates the test rate clock of 800 MHz that is obtained by halving the referred clock of 1.6 GHz ($L_d=2$).

The test rate clock divider 320 divides the second test rate clock output from the referred clock divider 310 so as to generate the second test rate divided clock having a frequency that is approximately the same as that of the second reference clock. The test rate clock divider 320 in the second test module 180a and the test rate clock divider 320 in the second test module 180b divide the corresponding referred clocks with division ratios of $1/N_c$ and $1/N_d$, respectively. For example, the test rate clock divider 320 in the second test module 180a generates the second test rate divided clock obtained by halving the second test rate clock of 400 MHz ($N_c=2$), and the test rate clock divider 320 in the second test module 180b generates the second test rate divided clock obtained by making the second test rate clock of 800 MHz the fourth ($N_d=4$).

The phase detector 330 detects a phase error between the second reference clock and the second test rate divided clock. The phase adjustment unit 332 adjusts the phase of the referred clock based on the phase error between the second reference clock and the second test rate divided clock, that was detected by the phase detector 330, and synchronizes the phase of the referred clock with the second reference clock.

The flip-flop 240 receives the pattern start signal for the domains C and D in synchronization with the second reference clock. The AND device 250 outputs AND of the pattern start signal received by the flip-flop 240 and the second test rate clock generated by the referred clock divider 310, thereby supplying the second test rate clock to the second driver unit 184 when the pattern start signal has a logical value "1".

As described above, the second test rate generation unit 182 provided in each of the second test modules 180a-180b can generate the second test rate clock that is in phase-synchronization with the second reference clock, by synchronizing the phase of the second test rate divided clock with the phase of the second reference clock. Please note that the phase of the second reference clock is synchronized with the phase of the first test rate clock by the second reference clock generation unit 130. Therefore, the second test rate generation unit 182 can generate the second test rate clock that is in phase-synchronization with the first test rate clock.

Figure 4:
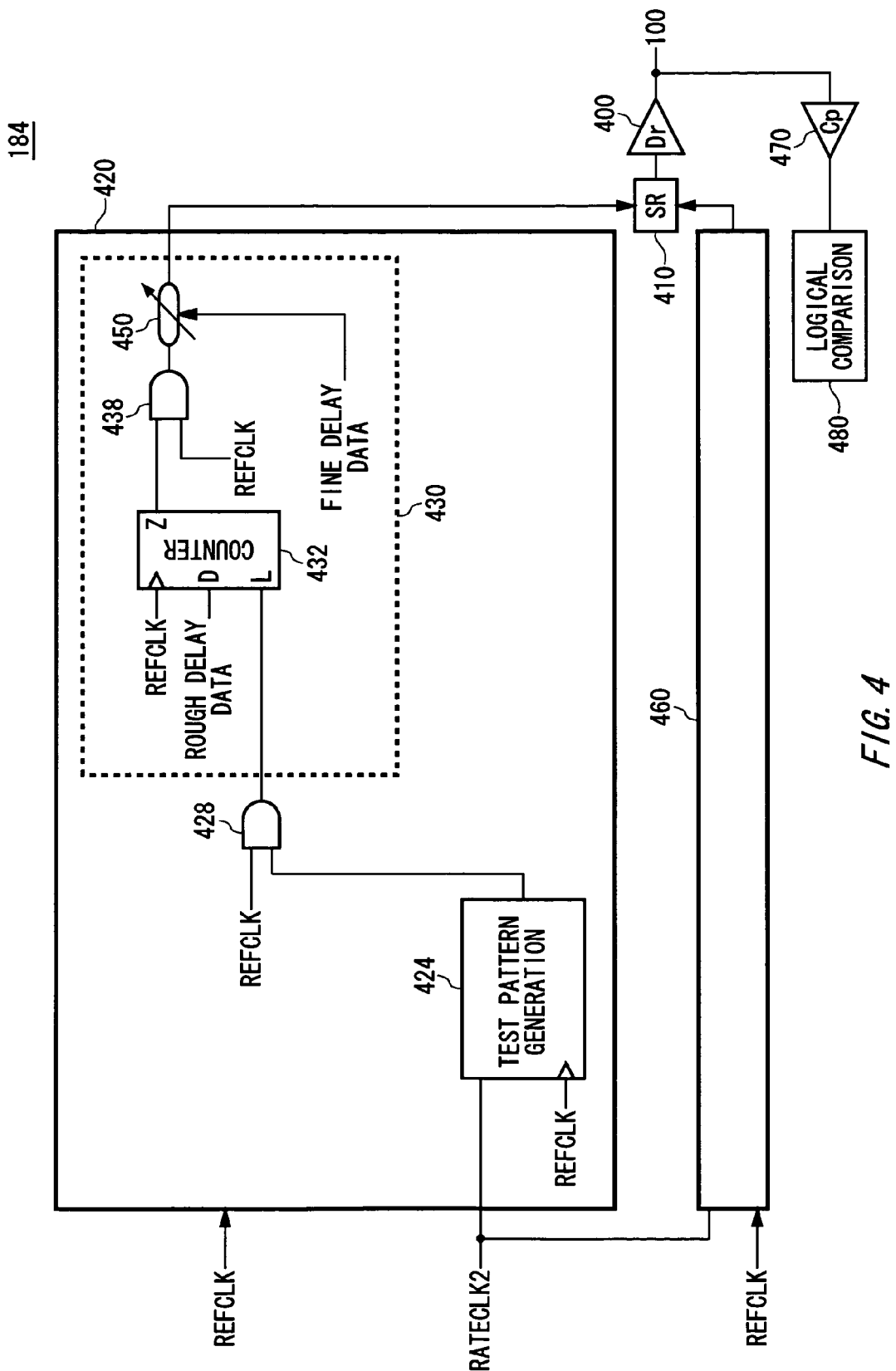
FIG. 4 illustrates a structure of the second driver unit 184 according to the embodiment of the present invention.

FIG. 4 illustrates the structure of the second driver unit 184 according to the present embodiment. The second driver unit 184 includes a set signal generation unit 420, a reset signal generation unit 460, an SR latch 410, the second driver 400, a comparator 470 and a logical comparator 480. The set signal generation unit 420 generates a set signal indicating a timing of a rising edge of the second test pattern based on the referred clock and the second test rate clock that were received from the second test rate generation unit 182. The reset signal generation unit 460 generates a reset signal indicating a timing of a falling edge of the second test pattern based on the referred clock and the second test rate clock that were received from the second test rate generation unit 182. The reset signal generation unit 460 has approximately the same structure and function as the set signal generation unit 420 and therefore the description of the reset signal generation unit 460 is omitted except for the differences from the set signal generation unit 420.

The SR latch 410 receives the set signal and the reset signal, and changes its output to a logical value "1" at the timing generated by the set signal generation unit 420 and also changes its output to a logical value "0" at the timing generated by the reset signal generation unit 460. Thus, the SR latch 410 generates the second test pattern based on the set signal and the reset signal. The comparator 470 detects whether or not an output signal that is output by the electronic device 100 in accordance with the test pattern exceeds a predetermined reference voltage, and supplies the detection result to the logical comparator 480. The logical comparator 480 compares the result of detection by the comparator 470 with an expected value of the output signal, thereby determining whether the electronic device 100 is non-defective or defective.

The set signal generation unit 420 includes a test pattern generator 424, an AND device 428 and a timing delay device 430.

The test pattern generator 424 outputs, for every pulse of the second test rate clock, the set signal for the second test pattern that is to be supplied to the electronic device 100 in a test cycle corresponding to that pulse, in synchronization with the referred clock. The test pattern generator 424 in the reset signal generation unit 460 outputs the reset signal for the second test pattern that is supplied to the electronic device 100 in a similar manner to that of the test pattern generator 424 in the set signal generation unit 420. The AND device 428 outputs AND of the set signal output from the test pattern generator 424 and the referred clock.

The timing delay device 430 delays each pulse of the second test rate clock so as to generate the second test pattern. More specifically, the timing delay device 430 receives the set signal for the second test pattern, that was output by the test pattern generator 424 to correspond to each pulse of the second test rate clock, via the AND device 428 and generates a delay signal obtained by delaying each pulse of the set signal for the second test pattern by a time determined to correspond to the second test pattern. Similarly, the timing delay device 430 in the reset signal generation unit 460 generates a delay signal obtained by delaying each pulse of the reset signal for the second test pattern, that was output by the test pattern generator 424, by a time determined to correspond to the second test pattern.

The timing delay device 430 includes a counter 432, an AND device 438 and a variable delay element 450. The counter 432 employs a structure that is similar to that of the counter 272 of the timing delay device 270, and outputs a level signal that is obtained by delaying each pulse of the set signal by a time of integer multiplication of the referred clock to its terminal Z based on rough delay data determined to correspond to that pulse.

The AND device 438 obtains AND of the referred clock and the level signal output from the counter 432, thereby converting the level signal output from the counter 432 into a pulse signal synchronized with the referred clock. The variable delay element 450 delays the set signal in which the position of each pulse was delayed by being delayed with the rough delay data, that was output from the AND device 438, by the fine delay amount specified by fine delay data that was determined to correspond to the second test pattern, and outputs the resultant signal as a set signal for the SR latch 410.

Figure 5:
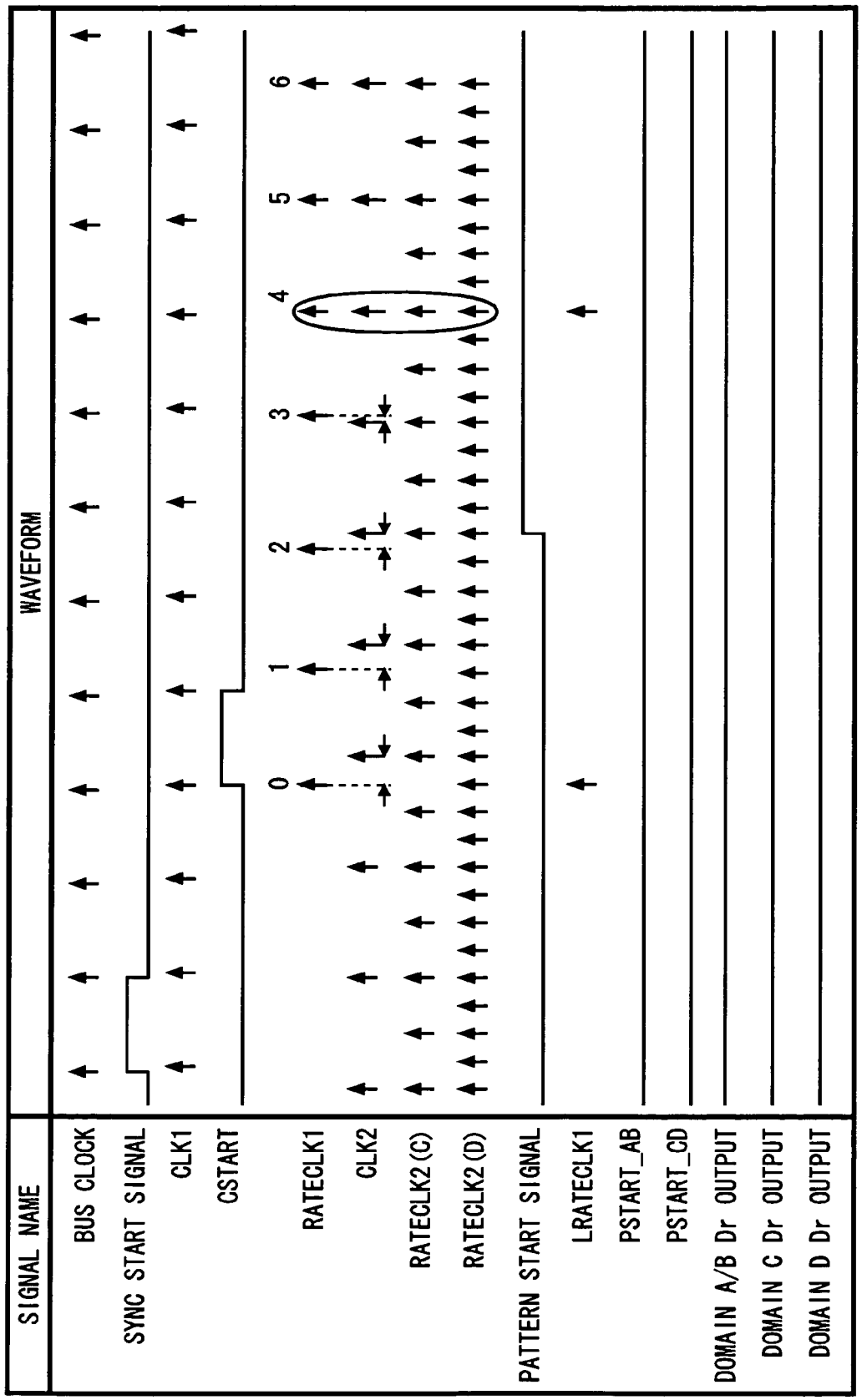
FIG. 5 is the first timing chart showing an operation timing of the test device 10 according to the embodiment of the present invention.
Figure 6:
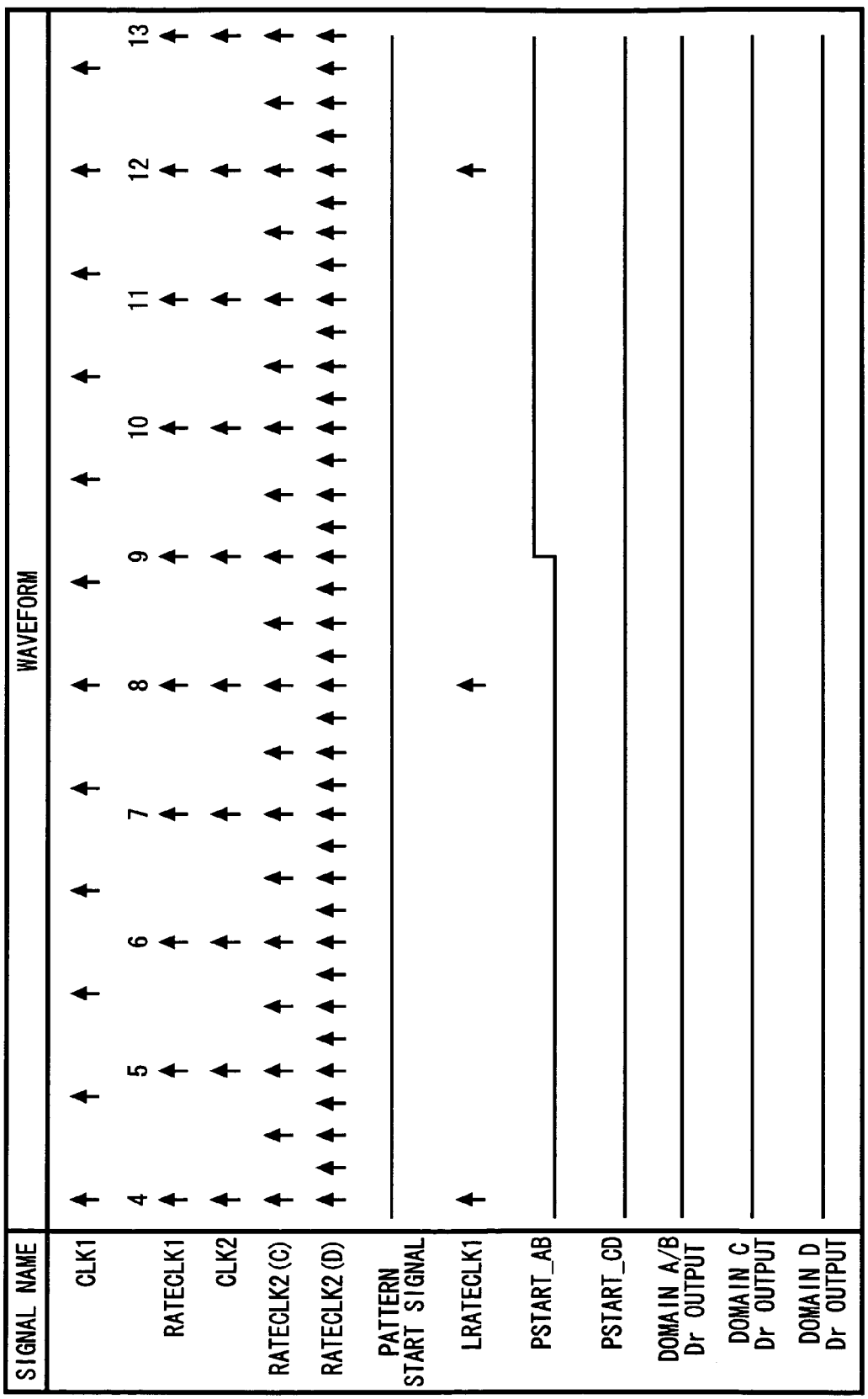
FIG. 6 is the second timing chart of the operation timing of the test device 10 according to the embodiment of the present invention.
Figure 7:
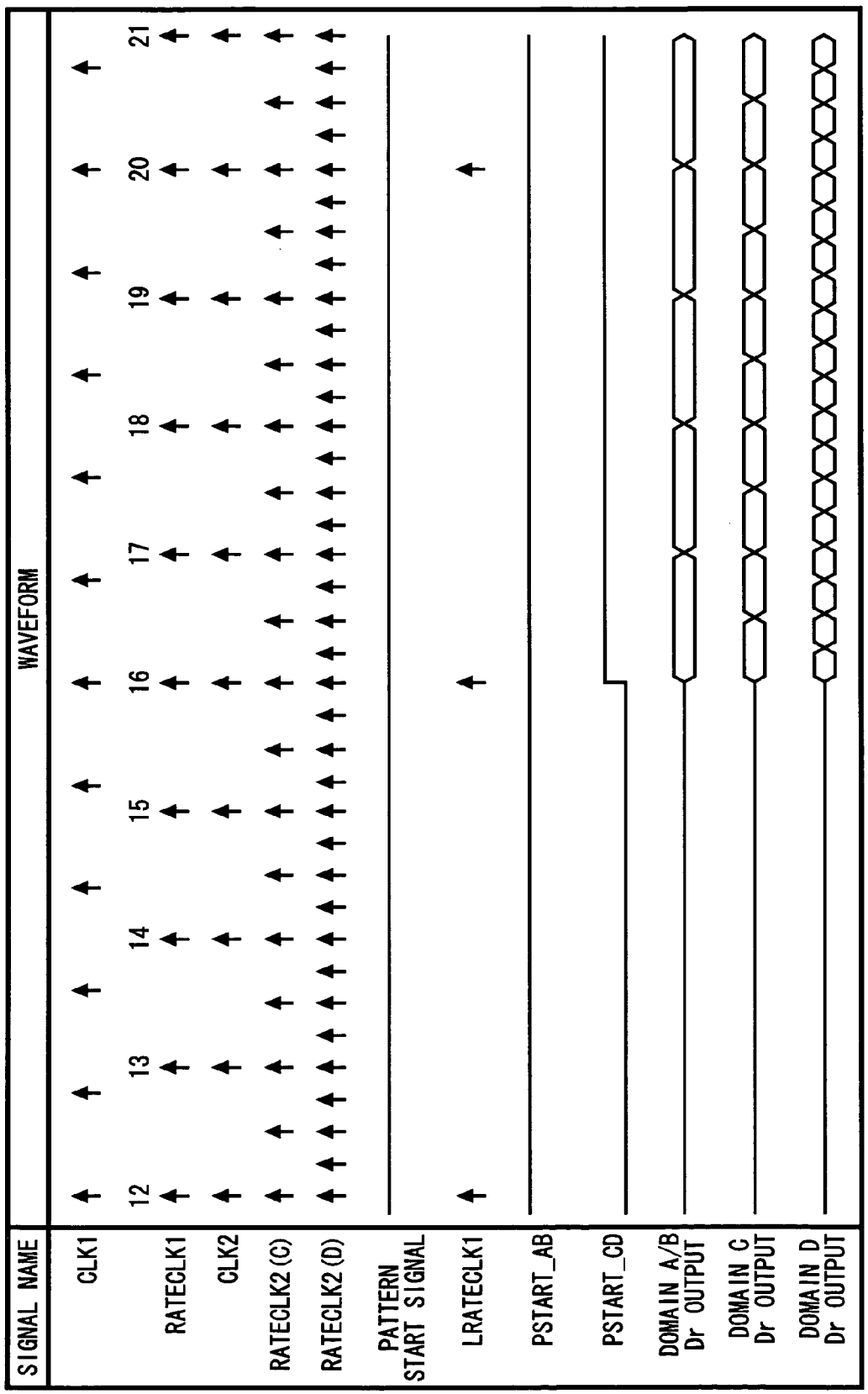
FIG. 7 is the third timing chart of the operation timing of the test device 10 according to the embodiment of the present invention.

FIGS. 5, 6 and 7 show operation timings of the test device 100 according to the present embodiment.

Referring to FIG. 5, the synchronization start signal supply unit 114 generates a synchronization start signal that causes the first test module 160b to start generation of the first test rate clock, prior to a start of a test, and supplies the synchronization start signal to the first test module 160b in synchronization with a rising edge (↑ in FIG. 5) of a bus clock. Then, the flip-flop 146 and a plurality of flip-flops 148 converts the synchronization start signal into a synchronization start signal CSTART synchronized with the first reference clock.

When receiving the synchronization start signal synchronized with the first reference clock, the first test rate generation unit 164 and the first driver unit 166 provided in each of the first test modules 160a and 160b generates a test period pulse signal by the test frequency generator 230. The frequency-divider 250 and the NOR device 252 in the first test rate generation unit 164 generate the first test rate divided clock LRATECLK1 based on the test period pulse signal. Moreover, the timing device delay device 270 of the first test rate generation unit 164 generates the first test rate clock RATECLK1 based on the test period pulse signal generated by the test frequency generator 230.

When receiving the first test rate clock, the phase synchronization unit 135 of the second reference clock generation unit 130 reduces the phase error between the second reference clock generated by the variable frequency clock generator 132 and the first test rate clock so as to synchronize the phase of the second reference clock with that of the first test rate clock at the pulse 4 and pulses after the pulse 4 of the first test rate clock. Please note that each of the second test rate clock in the second test module 180a (RATECLK2(C) in FIG. 5) and the second test rate clock in the second test module 180b (RATECLK2(D) in FIG. 5) is made in phase-synchronization with the second reference clock by the second test rate generation unit 182.

The pattern start signal generation unit 112 of the test controller 110 receives the phase error between the second reference clock and the first test rate clock from the phase detector 136, and generates a pattern start signal in a case where the phases of these clocks are in synchronization with each other or a case where they will be synchronized with each other in a predetermined time. That is, the pattern start signal generation unit 112 generates the pattern start signal in such a manner that the first driver unit 166 and the second driver unit 184 are allowed to start supply of the first test pattern and the second test pattern to the electronic device 100 while the second reference clock is in phase-synchronization with the first test rate clock.

The pattern start signal generated by the pattern start signal generation unit 112 is converted into a pattern start signal PSTART_AB synchronized with the first test rate clock, via the flip-flop 142, a plurality of flip-flops 144 and the first pattern start signal synchronization unit 150. Then, the pattern start signal "1" is supplied to the first test modules 160a-160b in synchronization with the pulse 9 of the first test rate clock shown in FIG. 6.

The pattern start signal generated by the pattern start signal generation unit 112 is also converted into a pattern start signal PSTART_CD synchronized with the second reference clock, via the flip-flop 142, a plurality of flip-flops 144 and the second pattern start signal synchronization unit 155. Then, the pattern start signal "1" is supplied to the second test modules 180a-180b in synchronization with the pulse 16 of the first test rate clock shown in FIG. 7.

In the timing delay device 270 of the first driver unit 166 and the timing delay device 430 of the second driver unit 184, the delay amounts are set in such a manner that the first driver unit 166 and the second driver unit 184 start the supply of the first test pattern and the second test pattern to the electronic device 100, respectively, in synchronization with each other based on the pattern start signal. In this manner, the first test modules 160a-160b and the second test modules 180a-180b can supply the first test pattern and the second test pattern from the first driver 200 and the second driver 400 to the electronic device 100, respectively, in synchronization with the pulse 16 of the first test rate clock shown in FIG. 7.

As described above, according to the test device 10 of the present embodiment, the first test pattern and the second test pattern can be supplied to the electronic device 100 in synchronization with each other by synchronizing the phase of the second reference clock and the phase of the first test rate clock with each other. In a case of using the first test rate clock having the period obtained by multiplying the period of the first reference clock by the scaling factor of period X and the second test rate clock that is a clock of a set frequency generated by the variable frequency generator 132 together, the test device 10 can make the phases and frequencies of them coincident with each other. Thus, the test device 10 can test the electronic device 100 including different blocks having different operating frequencies with high precision by using one or more first test modules 160 and one or more second test modules 180.

Figure 8:
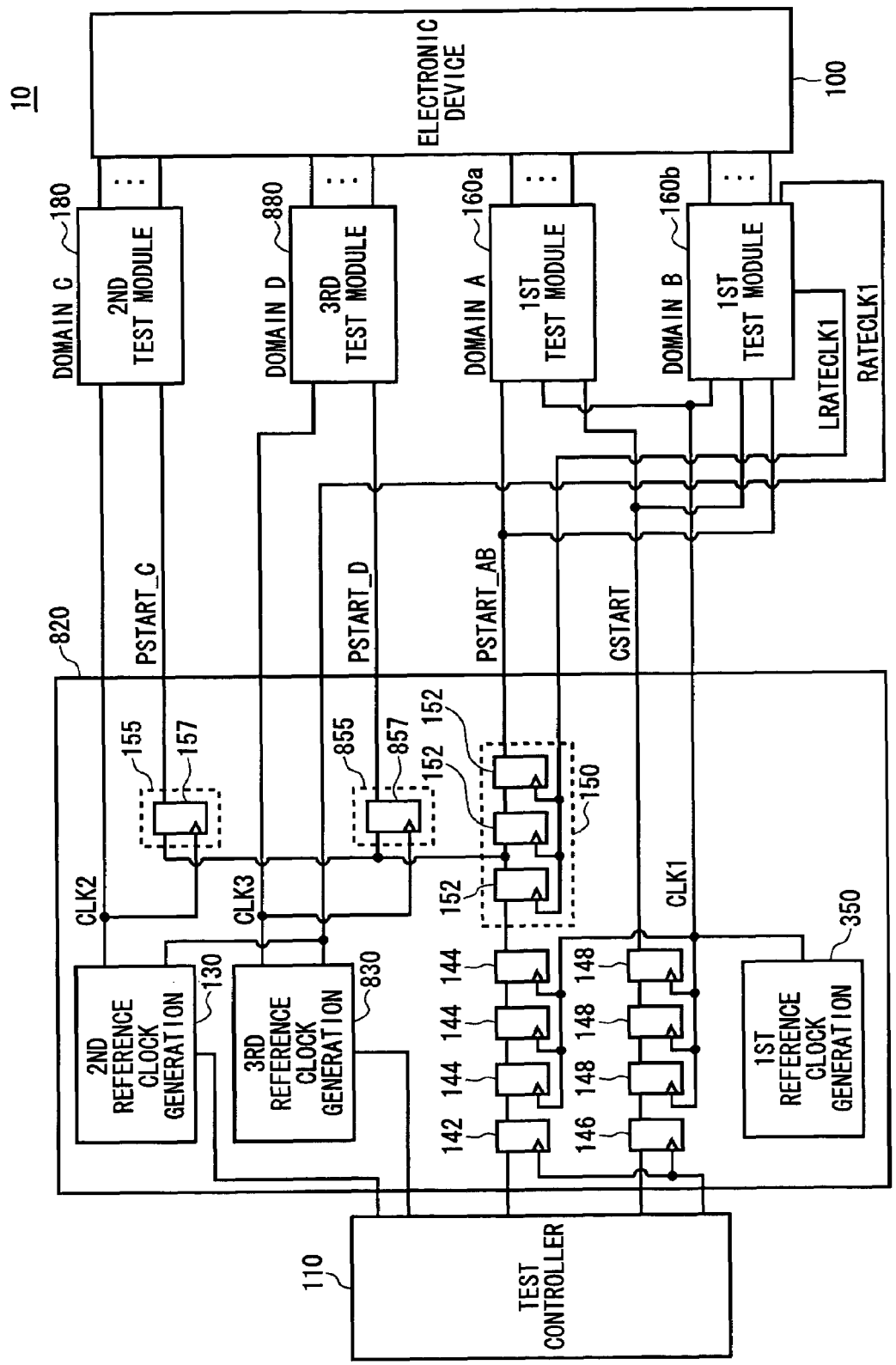
FIG. 8 illustrates a structure of a test device 100 according to the first modification of the embodiment of the present invention.

FIG. 8 illustrates a structure of a test device 10 according to the first modification of the above embodiment. The test device 10 of this modification includes a test controller 110, a clock supply unit 820, the first test modules 160a-160b, the second module 180 and the third test module 880. The test controller 110, the first test modules 160a-160b and the second test module 180 have approximately the same structures and functions as those labeled with the same reference numerals shown in FIG. 1, and therefore the description thereof is omitted except for differences. Moreover, the third test module 880 has approximately the same structure and function as the second test module 180 shown in FIG. 1 and therefore the description thereof is omitted except for differences.

The clock supply unit 820 includes the first reference clock generation unit 122, the second reference clock generation unit 130, a flip-flop 142, a plurality of flip-flops 144, a flip-flop 146, a plurality of flip-flops 148, the first pattern start signal synchronization unit 150, the second pattern start signal synchronization unit 155, the third reference clock generation unit 830 and the third pattern start signal synchronization unit 855. Since the first reference clock generation unit 122, the second reference clock generation unit 130, the flip-flop 142, the flip-flops 144, the flip-flop 146, the flip-flops 148, the first pattern start signal synchronization unit 150 and the second pattern start signal synchronization unit 155 have approximately the same structures and functions as those labeled with the same reference numerals in FIG. 1, the description thereof is omitted except for differences. Moreover, since the third reference clock generation unit 830 and the third pattern start signal synchronization unit 855 including a flip-flop 857 have approximately the same structures and functions as the second reference clock generation unit 130 and the second pattern start signal synchronization unit 155 including the flip-flop 157 shown in FIG. 1, the description thereof is omitted except for differences.

A variable frequency clock generator 132 included in the third reference clock generation unit 830 generates the third reference clock (CLK3 in FIG. 8) that is variable within a predetermined frequency range. A phase synchronization unit 135 included in the third reference clock generation unit 830 synchronizes the phase of the third reference clock with the phase of the first test rate clock that is fed back from the first test module 160b. The second test rate generation unit 182 in the third test module 880 generates the third test rate clock indicating a period with which the third test pattern is supplied to the electronic device 100, based on the third reference clock. Then, the second driver unit 184 of the third test module 880 supplies the third test pattern to the electronic device 100 based on the third test rate clock.

According to the test device 10 of the first modification mentioned above, it is possible to supply the first, second and third test patterns to the electronic device 100 while they are in phase-synchronization with each other, by synchronizing phases of a plurality of reference clocks that are variable within a predetermined frequency range with the phase of the first test rate clock.

Figure 9:
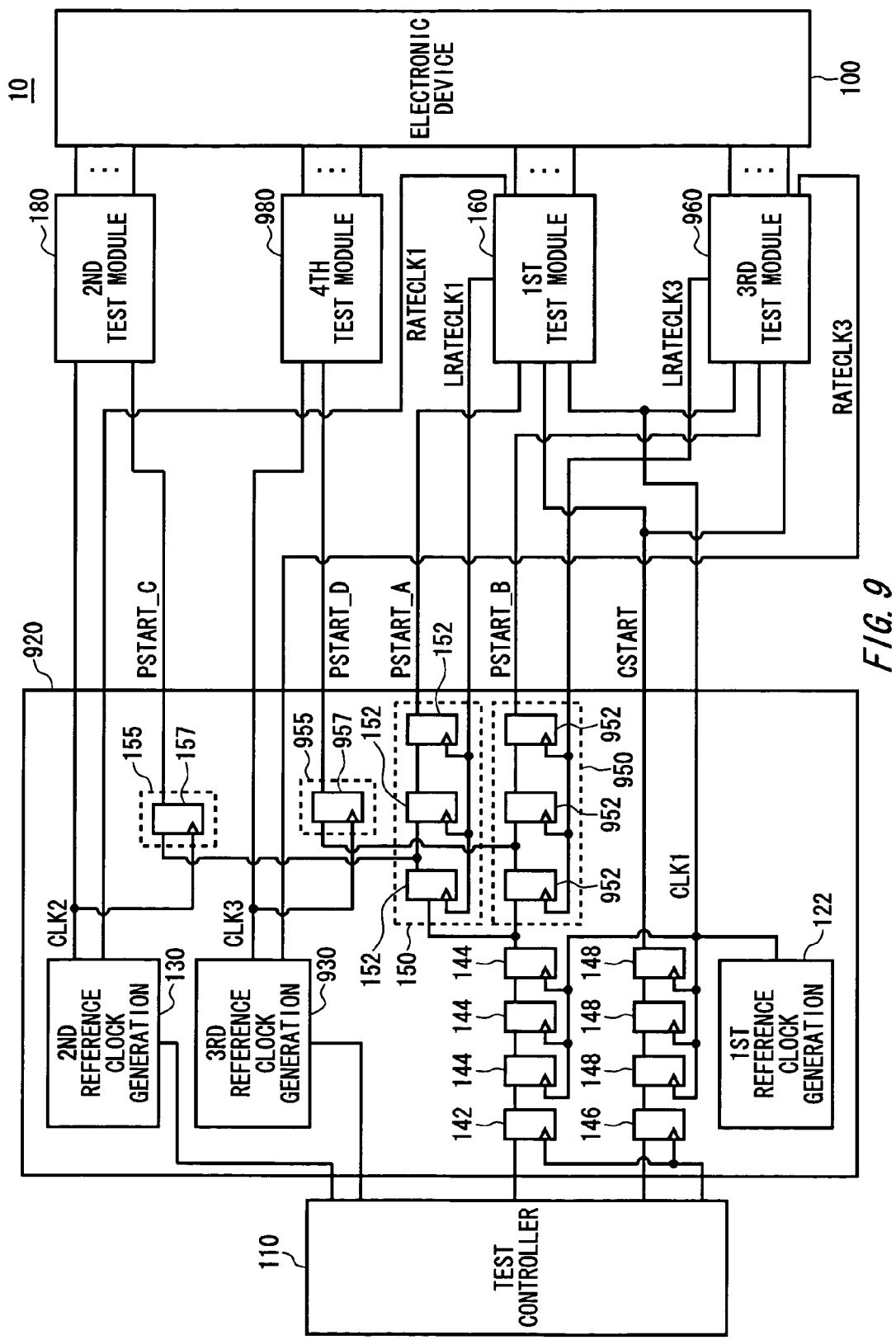
FIG. 9 illustrates a structure of a test device 100 according to the second modification of the embodiment of the present invention.

FIG. 9 illustrates a structure of a test device 10 according to the second modification of the above embodiment. The test device 10 of the second modification includes a test controller 110, a clock supply unit 920, the first test module 160, the second test module 180, the third test module 960 and the fourth test module 980. The test controller 110, the first test module 160 and the second test module 180 have approximately the same structures and functions as those labeled with the same reference numerals shown in FIG. 1, and therefore the description thereof is omitted except for differences. Moreover, the third test module 960 and the fourth test module 980 have approximately the same structures and functions as the first test module 160a and the second test module 180 shown in FIG. 1 and therefore the description thereof is omitted except for differences.

The clock supply unit 920 includes the first reference clock generation unit 122, the second reference clock generation unit 130, a flip-flop 142, a plurality of flip-flops 144, a flip-flop 146, a plurality of flip-flops 148, the first pattern start signal synchronization unit 150, the second pattern start signal synchronization unit 155, the third reference clock generation unit 930, the third pattern start signal synchronization unit 950 and the fourth pattern start signal synchronization unit 955. Since the first reference clock generation unit 122, the second reference clock generation unit 130, the flip-flop 142, the flip-flops 144, the flip-flop 146, the flip-flops 148, the first pattern start signal synchronization unit 150 and the second pattern start signal synchronization unit 155 have approximately the same structures and functions as those labeled with the same reference numerals in FIG. 1, the description thereof is omitted except for differences. Moreover, since the third reference clock generation unit 930, the third pattern start signal synchronization unit 950 including a plurality of flip-flops 952 and the fourth pattern start signal synchronization unit 955 including a flip-flip 957 have approximately the same structures and functions as the second reference clock generation unit 130, the first pattern start signal synchronization unit 150 including a plurality of flip-flops 152 and the second pattern start signal synchronization unit 155 including the flip-flop 157 shown in FIG. 1, the description thereof is omitted except for differences.

The first test rate generation unit 164 in the third test module 960 generates the third test rate clock indicating a period with which the third test pattern is supplied to the electronic device 100, based on the first reference clock supplied from the first reference clock generation unit 122. The first driver unit 166 in the third test module 960 supplies the third test pattern to the electronic device 100 based on the third test rate clock.

A variable frequency clock generator 132 included in the third reference clock generation unit 930 generates the third reference clock (CLK3 in FIG. 9) that is variable within a predetermined frequency range. A phase synchronization unit 135 included in the third reference clock generation unit 930 synchronizes the phase of the third reference clock with the phase of the third test rate clock that is fed back from the third test module 960. The second test rate generation unit 182 in the fourth test module 980 generates the fourth test rate clock indicating a period with which the fourth test pattern is supplied to the electronic device 100, based on the third reference clock. The second driver unit 184 in the fourth test module 980 supplies the fourth test pattern to the electronic device 100 based on the fourth test rate clock.

According to the test device 10 of the second modification, the first test module 160 and the third test module 960 generate the first test rate clock and the third test rate clock having different period from each other based on the first reference clock. Then, the second reference clock generation unit 130 synchronizes the phases of the second reference clock and the third reference clock that are variable within a predetermined frequency range with the phases of the first test rate clock and the third test rate clock, respectively, so that the first, second, third and fourth test patterns can be supplied to the electronic device 100 while they are in phase-synchronization.

Although the present invention has been described by way of exemplary embodiments, it should be understood that those skilled in the art might make many changes and substitutions without departing from the spirit and the scope of the present invention which is defined only by the appended claims.

As is apparent from the above description, according to the present invention, a test device can be provided that can test an electronic device including a plurality of blocks having different operating frequencies with high precision.

What is claimed is:

1. A test device for testing an electronic device, comprising:
   a first reference clock generation unit operable to generate a first reference clock having a first frequency;
   a first test rate generation unit operable to generate a first test rate clock indicating a period with which a first test pattern is supplied to said electronic device, based on said first reference clock;
   a first driver unit operable to supply said first test pattern to said electronic device based on said first test rate clock;
   a second reference clock generation unit operable to generate a second reference clock that is variable within a predetermined frequency range;
   a first phase synchronization unit operable to synchronize a phase of said second reference clock with a phase of said first test rate clock;
   a second test rate generation unit operable to generate a second test rate clock indicating a period with which a second test pattern is supplied to said electronic device, based on said second reference clock having said phase synchronized; and
   a second driver unit operable to supply said second test pattern to said electronic device based on said second test rate clock.

2. A test device as claimed in claim 1, wherein said first test rate generation unit includes:
   a test period generator operable to generate a test period pulse signal in which a number of pulses in unit time is approximately the same as said first test rate clock based on said first reference clock; and
   a first timing delay device operable to delay each of pulses in said test pulse signal in such a manner that intervals between pulses are approximately constant and to generate said first test rate clock, and said first phase synchronization unit synchronizes said phase of said second reference clock with said phase of said first test rate clock generated by said first timing delay device.

3. A test device as claimed in claim 2, wherein said second test rate generation unit includes:
   a reference clock oscillation unit operable to generate a reference clock having a frequency obtained by multiplying a frequency of said second reference clock by an integer that is equal to or larger than two;
   a reference clock divider operable to divide said reference clock to generate said second test rate clock; a test rate clock divider operable to divide said second test rate clock to generate a test rate divided clock having a frequency that is approximately the same as said frequency of said second reference clock; and
   a phase adjustment unit operable to adjust a phase of said reference clock based on a phase error between said second reference clock and said test rate divided clock.

4. A test device as claimed in claim 1, wherein said second reference clock generation unit includes:
   a variable frequency clock generator operable to generate a variable frequency clock that is variable within a predetermined frequency range; and
   a variable frequency clock divider operable to divide said variable frequency clock to generate said second reference clock having a frequency tat is approximately the same as a frequency of said first test rate clock, and wherein said first phase synchronization unit includes:
   a phase detector operable to detect a phase error between said first test rate clock and said second reference clock; and
   a phase adjustment unit operable to synchronize a phase of said variable frequency clock with said phase of said first test rate clock based on said phase error.

5. A test device as claimed in claim 1, further comprising a pattern start signal generation unit operable to generate a pattern start signal for starting supply of said first test pattern and said second test pattern to said electronic device while said second reference clock and said first test rate clock are in phase-synchronization with each other, wherein
   said first driver unit and said second driver unit start to supply said first test pattern and said second test pattern, respectively, based on said pattern start signal.

6. A test device as claimed in claim 5, further comprising:
   a first pattern start signal synchronization unit operable to synchronize said pattern start signal with said first test rate clock; and
   a second pattern start signal synchronization unit operable to synchronize said pattern start signal with said second test rate clock, wherein
   said first driver unit starts to supply said first test pattern based on said pattern start signal synchronized with said first test rate clock, and said second driver unit starts to supply said second test pattern based on said pattern start signal synchronized with said second test rate dock.

7. A test device as claimed in claim 1, wherein each of said first test rate generation unit and said first driver unit includes:
   a test period generator operable to a test period pulse signal that is the same as said first test rate clock in a number of pulses in unit time, based on said first reference clock; and
   a first timing delay device operable to generate a delay signal obtained by delaying each of pulses in said test period pulse signal, and said first timing delay device of the first test rate generation unit generates said first test rate clock that is said delay signal obtained by delaying each of pulses in said test period pulse signal to make intervals between said pulses approximately constant, and said first timing delay device of the first driver unit generates said first test pattern that is said delay signal obtained by delaying each of pulses in said test period pulse signal by a time determined in accordance with said first test pattern.

8. A test device as claimed in claim 7, further comprising:
   a pattern start signal generation unit operable to generate a pattern start signal for starting supply of said first test pattern and said second test pattern to said electronic device while said second reference clock and said first test rate clock are in phase- synchronization with each other, wherein said second driver unit includes a second timing delay device operable to generate said second test pattern by delaying each of pulses in said second test rate clock, and delay amounts arte set in said first timing delay device and said second timing delay device in such a manner that said first driver unit and said second driver unit start to supply said first test pattern and said second test pattern to said electronic device, respectively, in synchronization with each other based on said pattern start signal.

9. A test device as claimed in claim 8, further comprising a synchronization start signal supply unit operable to supply a synchronization start signal for causing said first test rate generation unit to start generation of said first test rate clock, in a case of starting said supply of said first test pattern and said second test pattern, wherein said pattern start signal generation unit generates said pattern start signal that causes said first driver unit and said second driver unit to start to supply said first test pattern and said second teat pattern to said electronic device, respectively, while said second reference clock is in phase-synchronization with said first test rate clock that said first test rate generation unit started to generate upon receipt of said synchronization start signal.

10. A test device as claimed in claim 1, further comprising:
a third reference clock generation unit operable to generate a third reference clock that is variable within a predetermined frequency range;
a second phase synchronization unit operable to synchronize a phase of said third reference clock with said phase of said first test rate clock;
a third test rate generation unit operable to generate a third test rate clock indicating a period with which a third test pattern is supplied to said electronic device, based on said third reference clock that was in phase-synchronization; and
a third driver unit operable to supply said third test pattern to said electronic device based on said third test rate clock.

11. A test device as claimed in claim 1, further comprising:
a third test rate generation unit operable to generate a third test rate clock indicating a period with which a third test pattern is supplied to said electronic device, based on said first reference clock;
a third driver unit operable to supply said third test pattern to said electronic device based on said third test rate clock;
a third reference clock generation unit operable to generate a third reference clock that is variable within a predetermined frequency range;
a second phase adjustment unit operable to synchronize a phase of said third reference clock with a phase of said third test rate clock;
a fourth test rate generation unit operable to generate a fourth test rate clock indicating a period with which a fourth test pattern is supplied to said electronic device, based on said third reference clock that was in phase-synchronization; and
a fourth driver unit operable to supply said fourth test pattern to said electronic device based on said fourth test rate clock.

12. A test device as claimed in claim 1, wherein the electronic device comprises a plurality of blocks, and wherein an operating frequency of a block in accordance with the first reference clock is different from an operating frequency of a block in accordance with the second reference clock.

* * * * *

UNITED STATES PATENT AND TRADEMARK OFFICE
CERTIFICATE OF CORRECTION

PATENT NO.        : 7,461,314 B2
APPLICATION NO.   : 11/124477
DATED             : December 2, 2008
INVENTOR(S)       : Noriaki Chiba et al.

Page 1 of 1

It is certified that error appears in the above-identified patent and that said Letters Patent is hereby corrected as shown below:

In the Claims:

In Claim 4, column 20, line 1, the word "tat" should be --t<u>h</u>at--.

In Claim 9, column 21, line 9, the word "teat" should be --te<u>s</u>t--.

Signed and Sealed this

Twenty-fourth Day of February, 2009

JOHN DOLL
*Acting Director of the United States Patent and Trademark Office*